(12) United States Patent
Kimura et al.

(10) Patent No.: US 7,847,468 B2
(45) Date of Patent: Dec. 7, 2010

(54) ULTRASONIC TRANSDUCER AND ULTRASONIC APPARATUS HAVING THE SAME

(75) Inventors: Wataru Kimura, Nagoya (JP); Hideaki Taki, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 231 days.

(21) Appl. No.: 12/057,546

(22) Filed: Mar. 28, 2008

(65) Prior Publication Data
US 2009/0015104 A1    Jan. 15, 2009

(30) Foreign Application Priority Data
Mar. 29, 2007 (JP) .............................. 2007-089453
Mar. 24, 2008 (JP) .............................. 2008-075896

(51) Int. Cl.
*H01L 41/053* (2006.01)
(52) U.S. Cl. ...................................... 310/322; 310/346
(58) Field of Classification Search ................. 310/322, 310/323.01–323.21, 346, 325, 365, 366
See application file for complete search history.

(56) References Cited

U.S. PATENT DOCUMENTS

| | | | |
|---|---|---|---|
| 6,784,599 B1 * | 8/2004 | Stoecklein et al. ........... | 310/364 |
| 7,557,492 B2 * | 7/2009 | Fripp et al. .................. | 310/346 |
| 7,627,936 B2 * | 12/2009 | Bromfield .................... | 29/25.35 |
| 2004/0035912 A1 * | 2/2004 | Li et al. ........................ | 228/110.1 |

FOREIGN PATENT DOCUMENTS

JP    2003-199195 A    7/2003

OTHER PUBLICATIONS

Machine translation of JP 2003-199195 generated by the website of the Japanese Patent Office.*

* cited by examiner

*Primary Examiner*—Walter Benson
*Assistant Examiner*—Derek J Rosenau
(74) *Attorney, Agent, or Firm*—Sughrue Mion, PLLC

(57) ABSTRACT

An ultrasonic transducer (101, 102, 103) includes: a front member (1, 1*a*) having a front side on which an ultrasonic radiating surface (11) is provided and a back side which is opposite to the front side; a side member (2, 2*a*); a backing member (3, 3*a*); and a piezoelectric ceramic body (4), which are provided axially integrally, wherein one end side of the side member (2, 2*a*) is fitted to the back side of the front member (1, 1*a*), one end side of the backing member (3, 3*a*) is fitted to another end side of the side member (2, 2*a*), and the piezoelectric ceramic body (4) is interposed between the front member (1, 1*a*) and the backing member (3, 3*a*).

14 Claims, 11 Drawing Sheets

ULTRASONIC TRANSDUCER AND ULTRASONIC APPARATUS HAVING THE SAME

BACKGROUND OF THE INVENTION

1. Field of the Invention

The present invention relates to an ultrasonic transducer and an ultrasonic apparatus having the same. More particularly, the present invention concerns an ultrasonic transducer in which a side portion of the transducer is formed by a side member separate from a front member to facilitate the processing of the surface against which a piezoelectric ceramic body of the front member abuts, e.g., an ultrasonic transducer in which the surface roughness of the abutment surface is improved to thereby make it possible to reduce the loss of propagation of the vibration of a piezoelectric element to the front member, as well as an ultrasonic apparatus having the ultrasonic transducer

2. Description of the Related Art

Conventionally, various ultrasonic transducers have been proposed, and a Langevin type ultrasonic transducer, for example, is known in which an opening groove is formed in a rear end face of a metallic vibratory block, and a piezoelectric vibratory element is fitted and held in this opening groove (e.g., refer to JP-A-2003-199195). In this ultrasonic transducer, the piezoelectric vibratory element and connection electrodes are accommodated in the interior of the vibratory block and are not exposed to an outer surface. Accordingly, the connection electrodes are not fouled, and a short-circuiting is prevented. In addition, an explanation is given that since the substantially entire surface of the outer peripheral surface is formed by the vibratory block, in a case where the ultrasonic transducer is used as a hand tool, the entire peripheral surface of the vibratory block can be held, and handling is facilitated.

3. Problems to be Solved by the Invention

However, in the above-described conventional ultrasonic transducer, since a front member, which is a vibration transmitting portion, and a side member with the piezoelectric vibratory element accommodated therein are integrally formed, the processing of the surface of the front member against which the piezoelectric vibratory element is abutted against is not easy, and there is a limit to improvement of the surface roughness of the abutment surface. Accordingly, there are cases where it is impossible to sufficiently improve the efficiency of vibration propagation from the piezoelectric vibratory element to the front member.

The present invention has been devised in view of the above-described conventional circumstances, and its object is to provide an ultrasonic transducer which facilitates the processing of the surface of the front member for abutment of a piezoelectric ceramic body as the side portion of the transducer is formed by a side member separate from the front member, and which, for example, is capable of improving the surface roughness of the abutment surface to thereby reduce the loss of propagation of the vibration of the piezoelectric element to the front member, as well as an ultrasonic apparatus having this ultrasonic transducer.

SUMMARY OF THE INVENTION

The present invention has the following characteristic features.

(1) An ultrasonic transducer comprising a front member having an ultrasonic radiating surface, a side member, a backing member, and a piezoelectric ceramic body which are provided axially integrally, wherein one end side of the side member is fitted to the front member on its side opposite to an ultrasonic radiating surface thereof, one end side of the backing member is fitted to another end side of the side member, and the piezoelectric ceramic body is interposed between the front member and the backing member.

(2) The ultrasonic transducer according to the above-described aspect (1), wherein the surface roughness (Ra) (arithmetical mean roughness) of an abutment surface of the front member against which one end face of the piezoelectric ceramic body abuts is not more than 12.5 µm.

(3) The ultrasonic transducer according to above-described aspect (2), wherein a fitting recess for fitting one end face side of the piezoelectric ceramic body is provided in the abutment surface.

(4) The ultrasonic transducer according to any one of the above-described aspects (1) to (3), wherein an insulator layer is interposed between an inner surface of the side member and an outer surface of the piezoelectric ceramic body.

(5) The ultrasonic transducer according to any one of the above-described aspects (1) to (4), wherein one of electrodes provided on the piezoelectric ceramic body is connected to an electrode terminal mounted on the backing member through the backing member as a conduction path, while an end portion of an electrode lead wire inserted in a lead wire insertion hole provided penetratingly through the backing member is connected to another of the electrodes provided on the piezoelectric ceramic body, and another end portion of the electrode lead wire is led out from another end side of the backing member.

(6) The ultrasonic transducer according to any one of the above-described aspects (1) to (5), wherein a material having a smaller internal loss of vibration than a constituent material of the backing member is used as a constituent material of the front member.

(7) The ultrasonic transducer according to the above-described aspect 6, wherein materials for constituting the front member and the backing member are selected so that the velocity of sound transmitted through the front member becomes higher than the velocity of sound transmitted through the backing member.

(8) The ultrasonic transducer according to any one of the above-described aspects (1) to (7), wherein the front member is formed of a material whose density is smaller than that of the constituent material of the backing member.

(9) The ultrasonic transducer according to any one of the above-described aspects (1) to (8), wherein a coefficient of thermal expansion of the side member has a value closer to the coefficient of thermal expansion of the piezoelectric ceramic body than the coefficients of thermal expansion of the front member and the backing member.

(10) The ultrasonic transducer according to any one of the above-described aspects (2) to (9), wherein the piezoelectric ceramic body has a first piezoelectric ceramic plate and a second piezoelectric ceramic plate, wherein the piezoelectric ceramic plate includes a first piezoelectric ceramic compact having a through hole extending in a thicknesswise direction; an electric conductor filled in the through hole of the first piezoelectric ceramic compact; a first one-surface side conductive layer provided on one surface side at a portion excluding a peripheral edge portion of the through hole; a first other-surface side conductive layer provided on another surface side at a portion excluding a portion of a peripheral edge portion thereof; and a first side-surface side conductive layer provided on a side surface and conductive to the first one-surface side conductive layer but not conductive to the first other-surface side conductive layer, wherein an odd number of the first piezoelectric ceramic plates are formed into a stacked body so that respective one-surface sides or respective other-surface sides abut against each other alternately, and a surface of the stacked body serving as a side of the front member is formed by the other surface side of the first piezoelectric ceramic compact and the first other-surface conductive layer, wherein the second piezoelectric ceramic plate includes a second piezoelectric ceramic compact; a second one-surface side conductive layer provided on one surface side of the second piezoelectric ceramic compact; a second other-surface side conductive layer provided on another surface side at a portion excluding a portion of a peripheral edge portion; and a second side-surface side conductive layer provided on a side surface and conductive to the first side-surface side conductive layer and the second one-surface side conductive layer but not conductive to the second other-surface side conductive layer, and wherein the second piezoelectric ceramic plate is interposed between the surface constituting the front member side of the stacked body and the abutment surface of the front member such that the second one-surface side conductive layer and the abutment surface abut against each other.

(11) The ultrasonic transducer according to any one of the above-described aspects (2) to (9), wherein the piezoelectric ceramic body has a first piezoelectric ceramic plate, wherein the piezoelectric ceramic plate includes a first piezoelectric ceramic compact having a through hole extending in a thicknesswise direction; an electric conductor filled in the through hole of the first piezoelectric ceramic compact; a first one-surface side conductive layer provided on one surface side at a portion excluding a peripheral edge portion of the through hole; a first other-surface side conductive layer provided on another surface side at a portion excluding a portion of a peripheral edge portion thereof; and a first side-surface side conductive layer provided on a side surface and conductive to the first one-surface side conductive layer but not conductive to the first other-surface side conductive layer, wherein an even number of first piezoelectric ceramic plates are formed into a stacked body so that respective one-surface sides or respective other-surface sides abut against each other alternately, and one surface and another surface of the stacked body are each formed by the first piezoelectric ceramic compact and the first one-surface conductive layer, and wherein an insulating recess having a larger diameter than a diameter of an end face of the electric conductor is provided in the abutment surface of the front member at a position opposing the end face of the conductor.

(12) The ultrasonic transducer according to any one of the above-described aspects (2) to (9), wherein the piezoelectric ceramic body has a first piezoelectric ceramic plate, wherein the piezoelectric ceramic plate includes a first piezoelectric ceramic compact having a through hole extending in a thicknesswise direction; an electric conductor filled in the through hole of the first piezoelectric ceramic compact; a first one-surface side conductive layer provided on one surface side at a portion excluding a peripheral edge portion of the through hole; a first other-surface side conductive layer provided on another surface side at a portion excluding a portion of a peripheral edge portion thereof; and a first side-surface side conductive layer provided on a side surface and conductive to the first one-surface side conductive layer but not conductive to the first other-surface side conductive layer, wherein an even number of first piezoelectric ceramic plates are formed into a stacked body so that respective one-surface sides or respective other-surface sides abut against each other alternately, and one surface and another surface of the stacked body are each formed by the first piezoelectric ceramic compact and the first one-surface conductive layer, and wherein an unpolarized ceramic plate is interposed between the stacked body and the abutment surface of the front member.

(13) An ultrasonic apparatus comprising the ultrasonic transducer according to any one of the above-described aspects (1) to (12).

In the ultrasonic transducer in accordance with the invention, since the side member formed as a separate unit is fitted to the front member, the processing of the abutment surface against which one end face of the piezoelectric ceramic body abuts is facilitated, so that, for example, the surface roughness of the abutment surface can be improved, thereby making it possible to reduce the loss of propagation of the vibration of the piezoelectric element to the front member.

In addition, in the invention, since the side portion of this ultrasonic transducer is constituted by the side member which is separate from the front member and the backing member, as described above, the desired functional elements required for the product can be allotted to the members in a more finely divided form. Consequently, it becomes possible to select constituent materials more suitable for the respective members. In other words, according to the invention, it becomes possible to form the individual members by making most of the characteristics of the selected materials.

Furthermore, in the invention, since the side member is formed separately from the front member and the backing member, and further division of the component parts is attempted, as described above, the workability of the single-piece parts can be improved. As a result, it becomes possible effect, among others, the application of a complex part configuration to the structure of the single-piece part for enhancing the function as a product. Therefore, according to the invention, it is possible to enhance the degree of freedom in the selection of the configurations of the respective parts making up the ultrasonic transducer.

In addition, in the case where the surface roughness (Ra) of the abutment surface of the front member against which one end face of the piezoelectric ceramic body abuts is not more than 12.5 µm, it is possible to sufficiently reduce the loss of propagation of the vibration of the piezoelectric element to the front member.

Furthermore, in the case where a fitting recess for fitting one end face side of the piezoelectric ceramic body is provided in the abutment surface, it is possible to suppress the positional offset of the piezoelectric ceramic body at the abutment surface and prevent the vibration from being hampered due to the contact between the piezoelectric ceramic body and the side member.

In addition, in the case where an insulator layer is interposed between an inner surface of the side member and an outer surface of the piezoelectric ceramic body, it is possible to improve electric insulation properties of the piezoelectric ceramic body, particularly electric insulation properties between the conductive layer provided on the piezoelectric ceramic body and the inner surface of the side member in a case where the conductive layer is provided on the side surface of the piezoelectric ceramic body.

Furthermore, one of the electrodes provided on the piezoelectric ceramic body is connected to the electrode terminal mounted on the backing member by using the backing member as a conduction path, while an end portion of the electrode lead wire inserted in the lead wire insertion hole provided penetratingly through the backing member is connected to the other electrode, and the other end portion of the electrode lead wire is led out from the other end side of the backing member. In such a case, since only one electrode lead wire is used for leading out the electrode to the outside, the structure for leading out the electrode is simplified, with the result that the structure of the overall device can be simplified.

In addition, as the front member is formed of a material whose vibration propagation loss is smaller than the backing member (e.g., a material in which the velocity of sound transmitted through the material itself is high), the vibrations generated by the piezoelectric ceramic body can be efficiently propagated to the ultrasonic radiating surface side at the distal end of the front member.

Further, in the case where the front member is made more lightweight than the backing member, the front member side can be displaced on a larger scale than the backing member side on the basis of the vibrations generated by the piezoelectric ceramic body, thereby making it possible to obtain stable vibrations with large amplitudes on the ultrasonic radiating surface side.

In addition, as the side member is formed of a material whose coefficient of thermal expansion is approximate to the coefficient of thermal expansion of the piezoelectric ceramic body, it is possible to minimize the difference between the amount of expansion and contraction of the side member, which expands or contracts due to the temperature change of the working environment, and the amount of expansion and contraction of the piezoelectric ceramic body. Hence, it is possible to improve the temperature characteristics of the ultrasonic transducer.

In addition, in a case where the piezoelectric ceramic body is provided in which an odd number of the first piezoelectric ceramic plates and the second piezoelectric ceramic plate are stacked, the structure for leading out the electrode can be simplified, and the structure of the element as a whole can also be simplified.

Furthermore, in a case where the piezoelectric ceramic body is provided in which an even number of first piezoelectric ceramic plates are stacked, and an insulating recess having a larger diameter than the diameter of the end face of the electric conductor is provided in the surface of the front member for abutment of the piezoelectric ceramic body at a position opposing the end face of the conductor, and in a case where an unpolarized ceramic plate is interposed between the stacked body in which the even number of first piezoelectric ceramic plates are stacked and the surface of the front member for abutment of the piezoelectric ceramic body, the piezoelectric ceramic body can be fabricated by a plurality of piezoelectric ceramic plates having an identical configuration. Therefore, the piezoelectric ceramic body can be fabricated easily.

Since the ultrasonic apparatus of the invention has the ultrasonic transducer, the ultrasonic apparatus of the invention is useful as a compact handy-type ultrasonic apparatus particularly for such as dental scaling and the like.

DESCRIPTION OF REFERENCE NUMERALS

Figure 1:
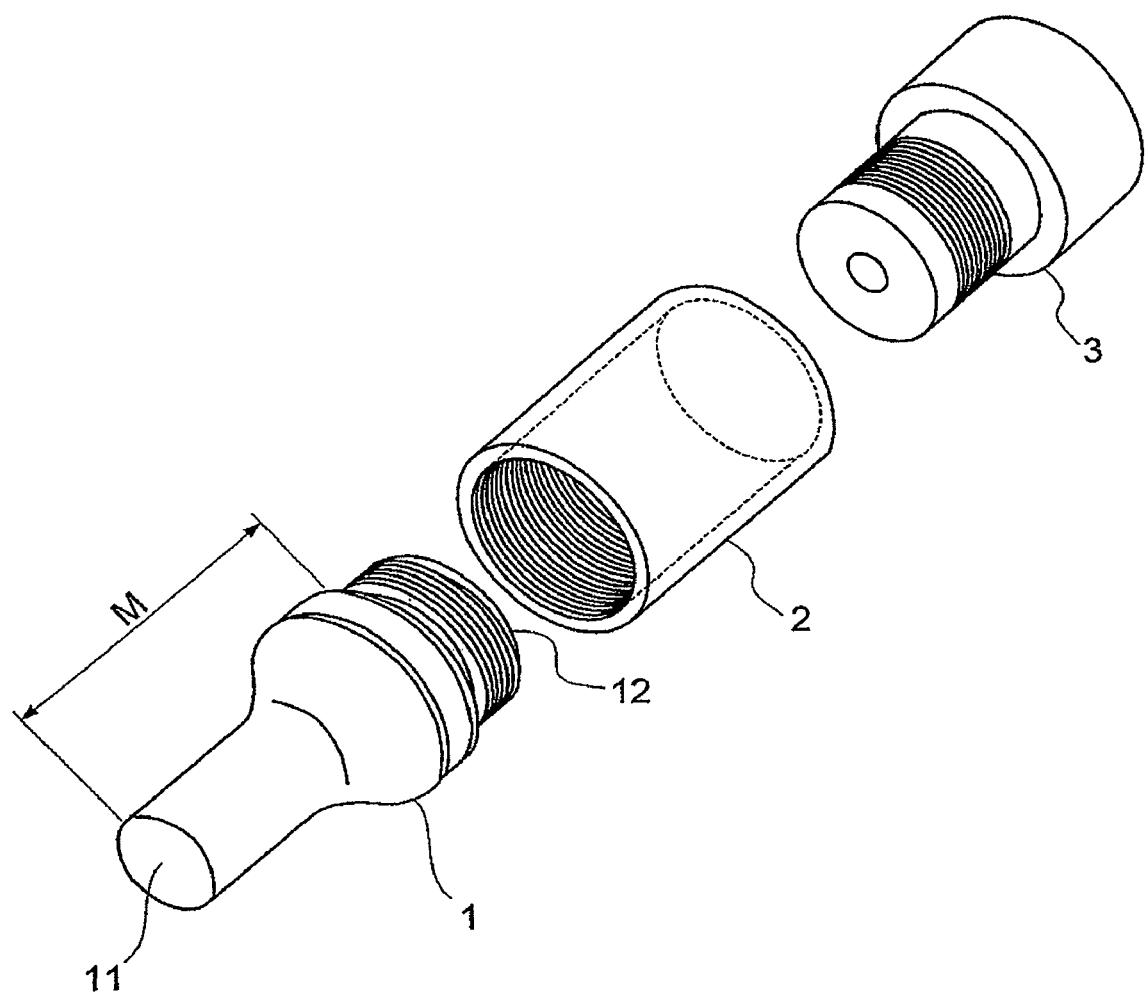
FIG. 1 is an exploded perspective view of a front member, a side member, and a backing member.
Figure 2:
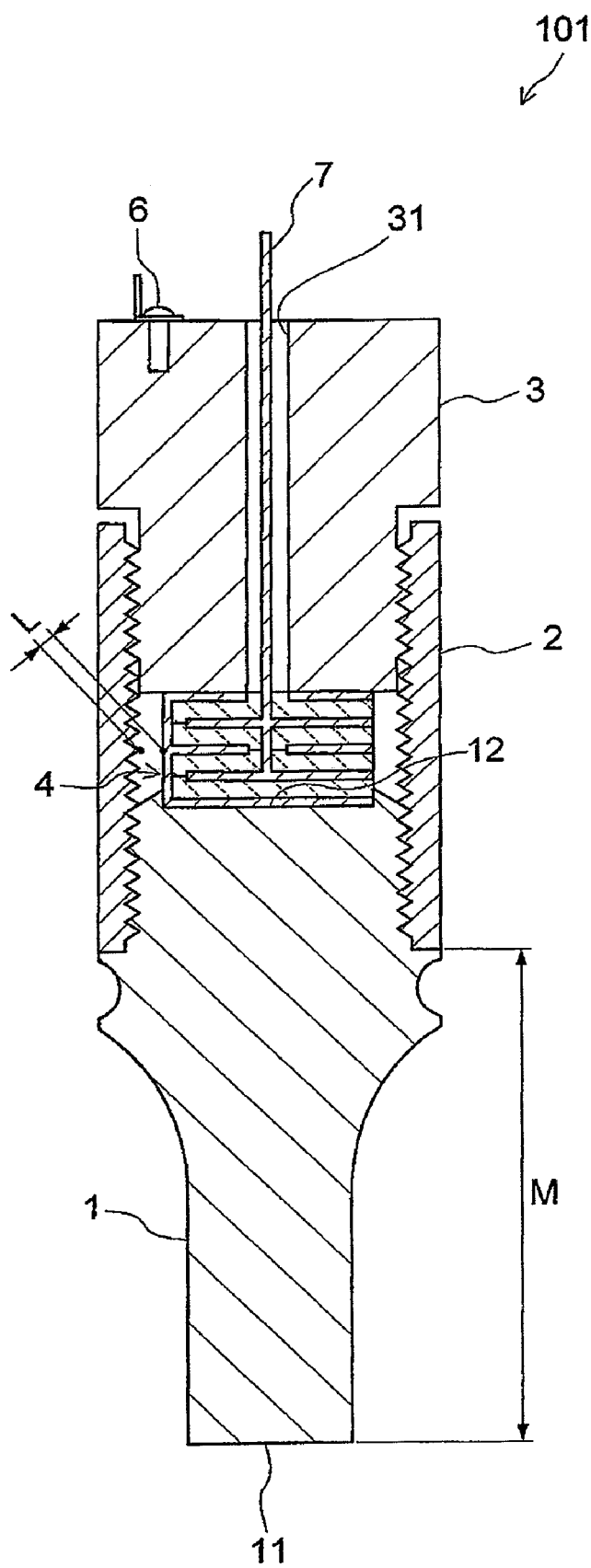
FIG. 2 is a schematic cross-sectional view of an ultrasonic transducer in accordance with the invention.

Reference numerals and signs used to identify various structural features in the drawings include the following. 101, 102, 103: ultrasonic transducer, 1, 1a: front member, 11: ultrasonic radiating surface, 12: abutment surface, 121: fitting recess, 122: insulating recess, 2, 2a: side member, 3, 3a: backing member, 31: lead wire insertion hole, 4: piezoelectric ceramic body, 41: first piezoelectric ceramic body, 421: first one-surface side conductive layer, 422: first other-surface side conductive layer, 423: first side-surface side conductive layer, 424: electric conductor, 43: second piezoelectric ceramic plate, 441: second one-surface side conductive layer, 442: second other-surface side conductive layer, 443: second side-surface side conductive layer, 45, 46: portion where the conductive layer is not provided, 5: insulator layer, 6: electrode terminal, 7: electrode lead wire, 8: unpolarized ceramic plate

DETAILED DESCRIPTION OF THE INVENTION

Referring now to FIGS. 1 to 13, a detailed description will be given of the invention.

An ultrasonic transducer 101 in accordance with the invention includes axially integrally a front member 1; a side member 2 having one end side fitted to the front member 1 on its side opposite to an ultrasonic radiating surface 11 thereof; a backing member 3 having one end side fitted to the other end side of the side member 2; and a piezoelectric ceramic body 4 interposed between an end face of the front member 1 on its side opposite to the ultrasonic radiating surface 11 thereof and the one end-side end face of the backing member 3.

This ultrasonic transducer 101 is a so-called a Langevin type ultrasonic transducer and is characterized in that the side member 2 which is conventionally formed integrally with the front member 1 is fitted to the front member 1 as a separate member.

The aforementioned "front member 1" has the ultrasonic radiating surface, and ultrasonic waves are radiated from this ultrasonic radiating surface 11 toward a medium. Since it is preferred that the front member 1 have such sufficient strength that the front member 1 is difficult to undergo such as breakage even if it is brought into contact with another article or the like, the front member 1 is formed of a metal. The kind of this metal is not particularly limited, and it is possible to use various metals. As the metal, a so-called light metal is preferable in which ρC (density×sound velocity) is not substantially different from that of the piezoelectric ceramic body 4 among the metals. As the light metals, it is possible to cite light metals such as aluminum, magnesium, berylium, and titanium, and alloys thereof. However, in the light of the material strength, ρC, the availability of the material, and the like, titanium, aluminum, and alloys containing these light metals, among others, are frequently used. In addition, if ρC is small, there is an advantage in that the transducer can be made compact. Further, the front member 1 may be formed of stainless steel or the like provided with chromium plating.

In addition, although the shape of the front member 1 is not particularly limited, it is possible to adopt such as a cylindrical shape, a circular truncated cone shape, or a shape in which a circular truncated cone or a small-diameter cylinder is extended from one surface side of a cylinder or a circular disk. Further, one end face of the piezoelectric ceramic body 4 is abutted against the end face of the front member 1 on the side opposite to the ultrasonic radiating surface 11 thereof, and this abutment surface 12 (end face of the front member 1) is preferably a surface having small surface roughness. The surface roughness (Ra) of the abutment surface 12 should be preferably not more than 12.5 μm, more preferably not more than 6.4 μm (normally, not less than 0.01 μm). If the surface roughness of the abutment surface 12 is thus small, it is possible to sufficiently reduce the loss of propagation of the vibration of the piezoelectric ceramic body 4 to the front member 1.

The method of measuring the surface roughness of the abutment surface 12 is not particularly limited, and it is possible to perform measurement in conformity to, for example, JIS B 0601 (1994). Specifically, it is possible to cite such as a method in which the abutment surface 12 is observed with an atomic force microscope (AFM; as a measuring apparatus it is possible to use such as Model "SPA400" made by Seiko Instruments Inc.), an the surface roughness of the abutment surface 12 is calculated from the obtained data.

Figure 3:
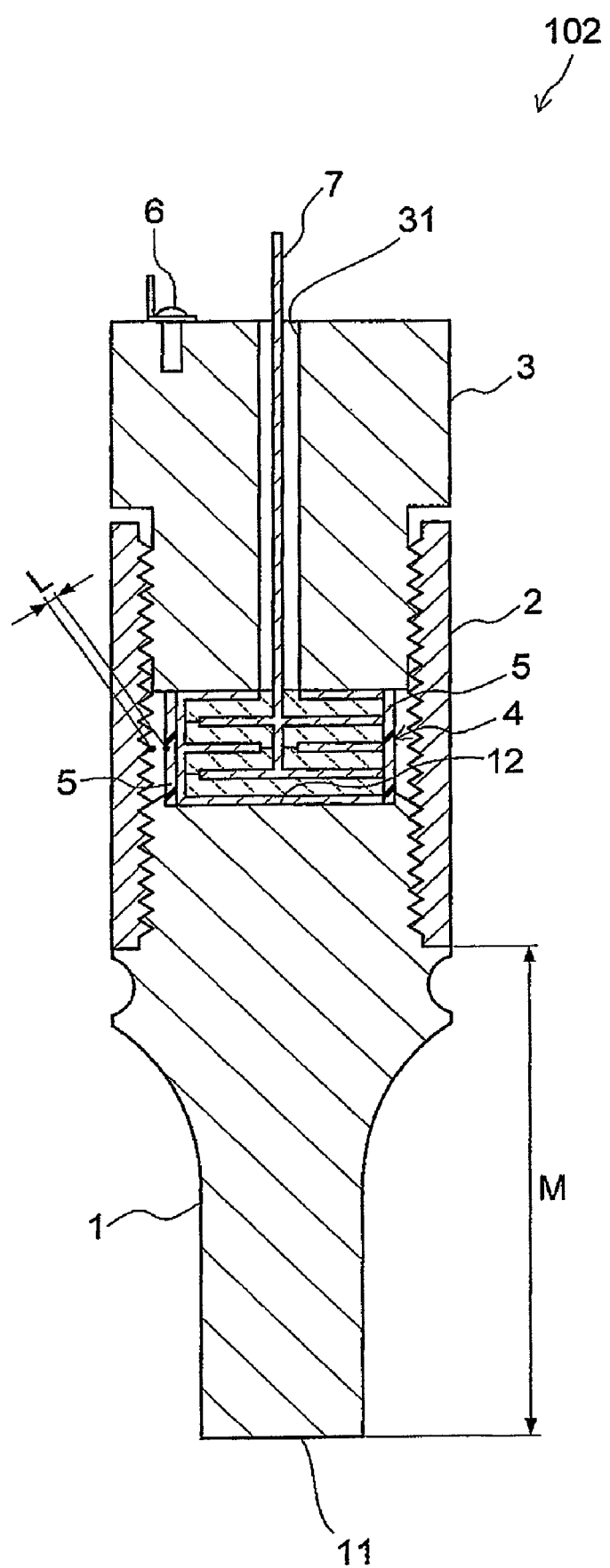
FIG. 3 is a cross-sectional view of the ultrasonic transducer in accordance with another embodiment in which an insulator layer is provided on an outer peripheral surface of a piezoelectric ceramic body.

Although the axial dimension of the front member 1 is not particularly limited, the dimension M of the axial length of the front member 1 from its boundary with the side member 2 to the ultrasonic radiating surface 11 should preferably be a dimension which is substantially equal to a multiple of a natural number of a ¼ wavelength of an ultrasonic wave that propagates the ultrasonic transducer 101 (see FIG. 2) or 102 (an ultrasonic transducer having an insulator layer 5 in FIG. 3). By so doing, it is possible to maximize the amplitude of the ultrasonic radiating surface 11, so that it becomes possible to radiate ultrasonic waves of large amplitude to the medium. Although to what multiple of the ¼ wavelength the axial dimension of the front member 1 is set is not particularly limited, the greater this multiple, the higher the resonance frequency, and the more unwanted modes of vibration increase. For this reason, this multiple should preferably be a lowest possible multiple, so that this multiple is in many cases onefold, i.e., a dimension which is substantially equal to the ¼ wavelength of the ultrasonic wave.

The aforementioned dimension which is substantially equal to a multiple of a natural number of the ¼ wavelength of the ultrasonic wave means that a vibration node portion is located within the range of a fitting portion between the front member 1 and the side member 2, and it is generally a dimension falling within the range of 80 to 120% of a multiple of a natural number of the ¼ wavelength. By so doing, it is possible to maximize the amplitude of the ultrasonic radiating surface 11 and reduce the stress applied as a load to the fitting portion whose strength is lower in comparison with the other portions, thereby making it possible to suppress the deformation and the like of the ultrasonic transducer 101 or 102.

Figure 4:
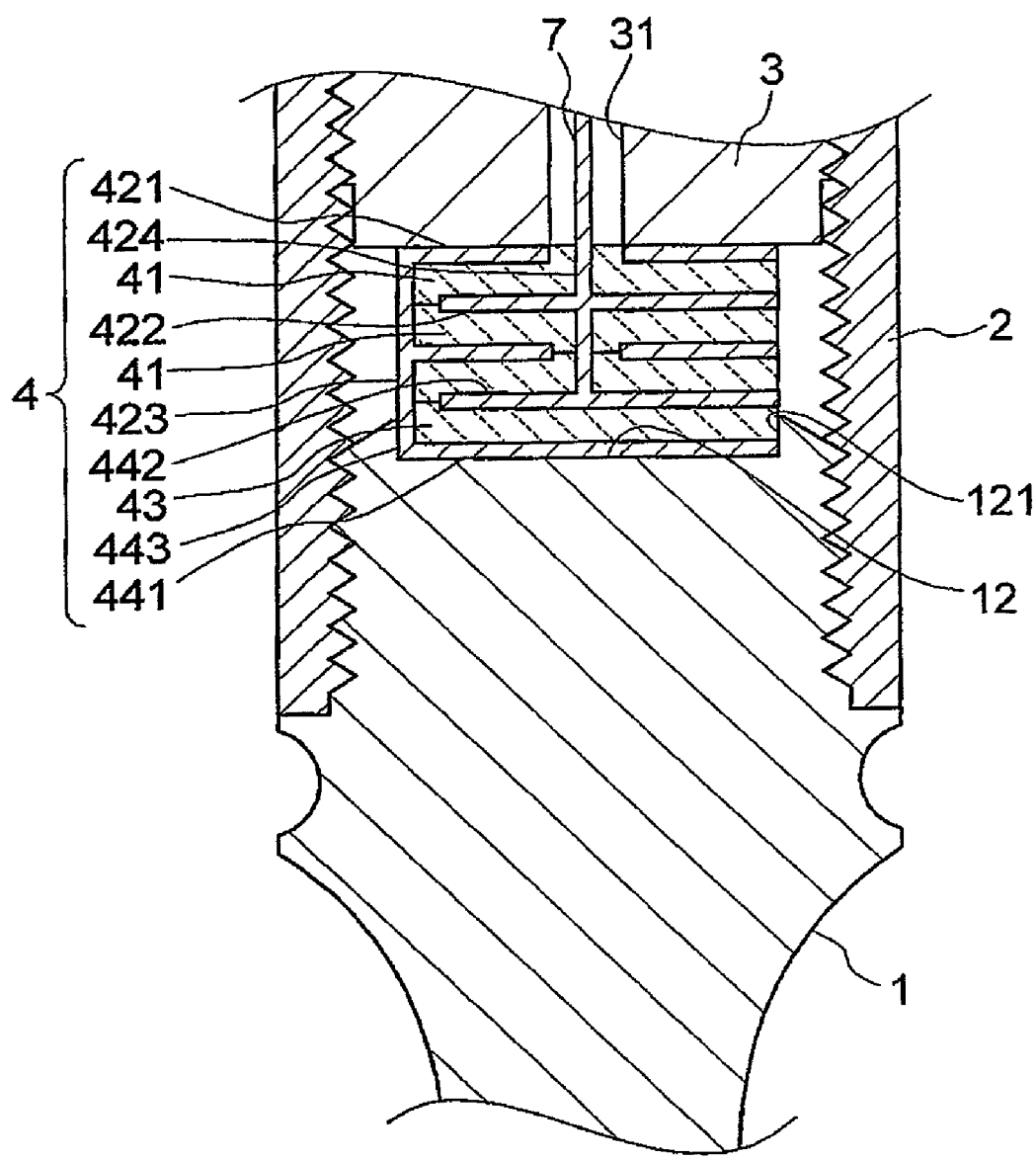
FIG. 4 is an enlarged cross-sectional view for explaining in enlarged form the piezoelectric ceramic body and its vicinities of the ultrasonic transducer shown in FIG. 2.
Figure 8:
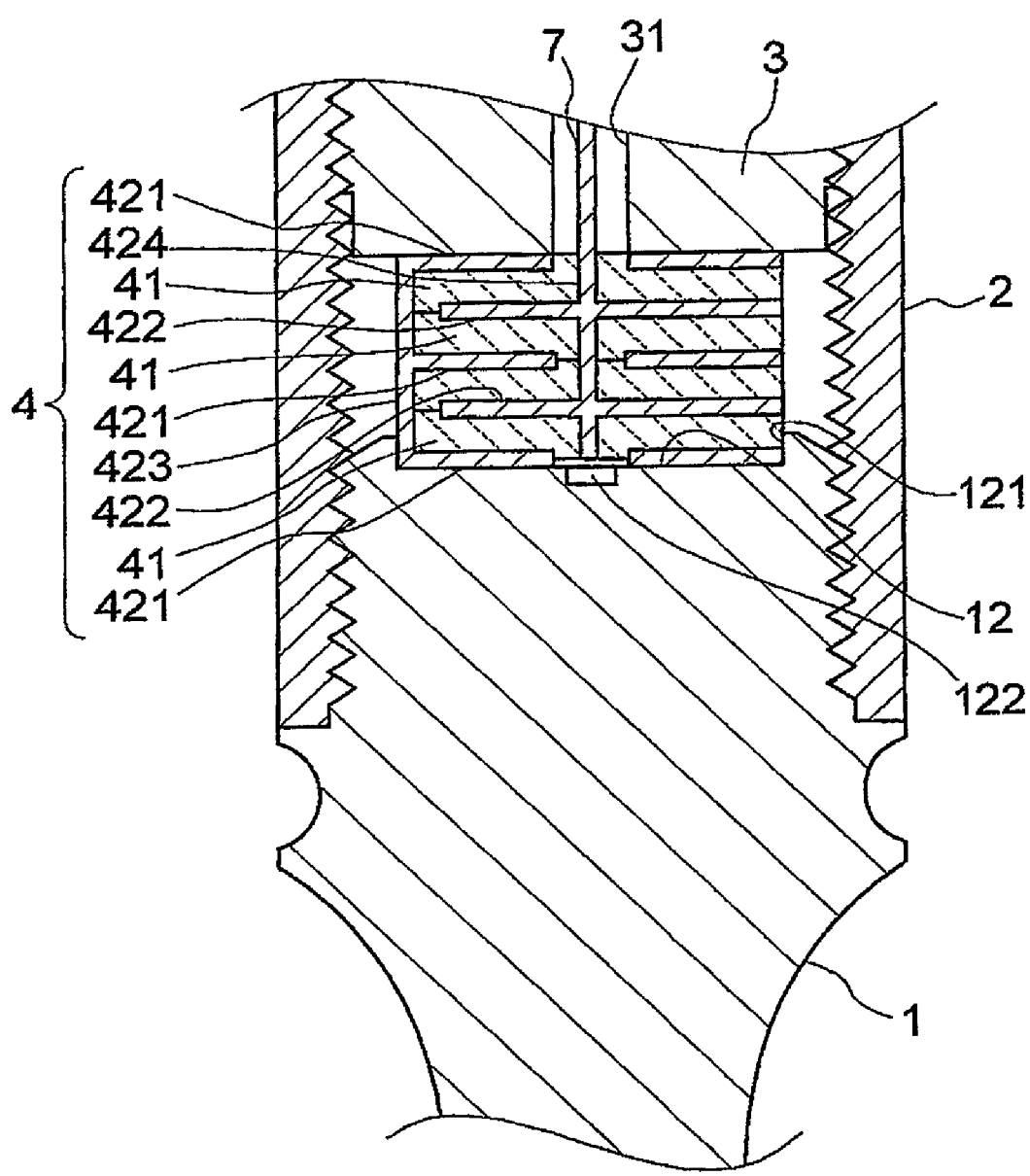
FIG. 8 is an enlarged cross-sectional view for explaining in enlarged form the piezoelectric ceramic body and its vicinities of the ultrasonic transducer in accordance with another embodiment in which its structure is different from that of the ultrasonic transducer in FIG. 2.
Figure 10:
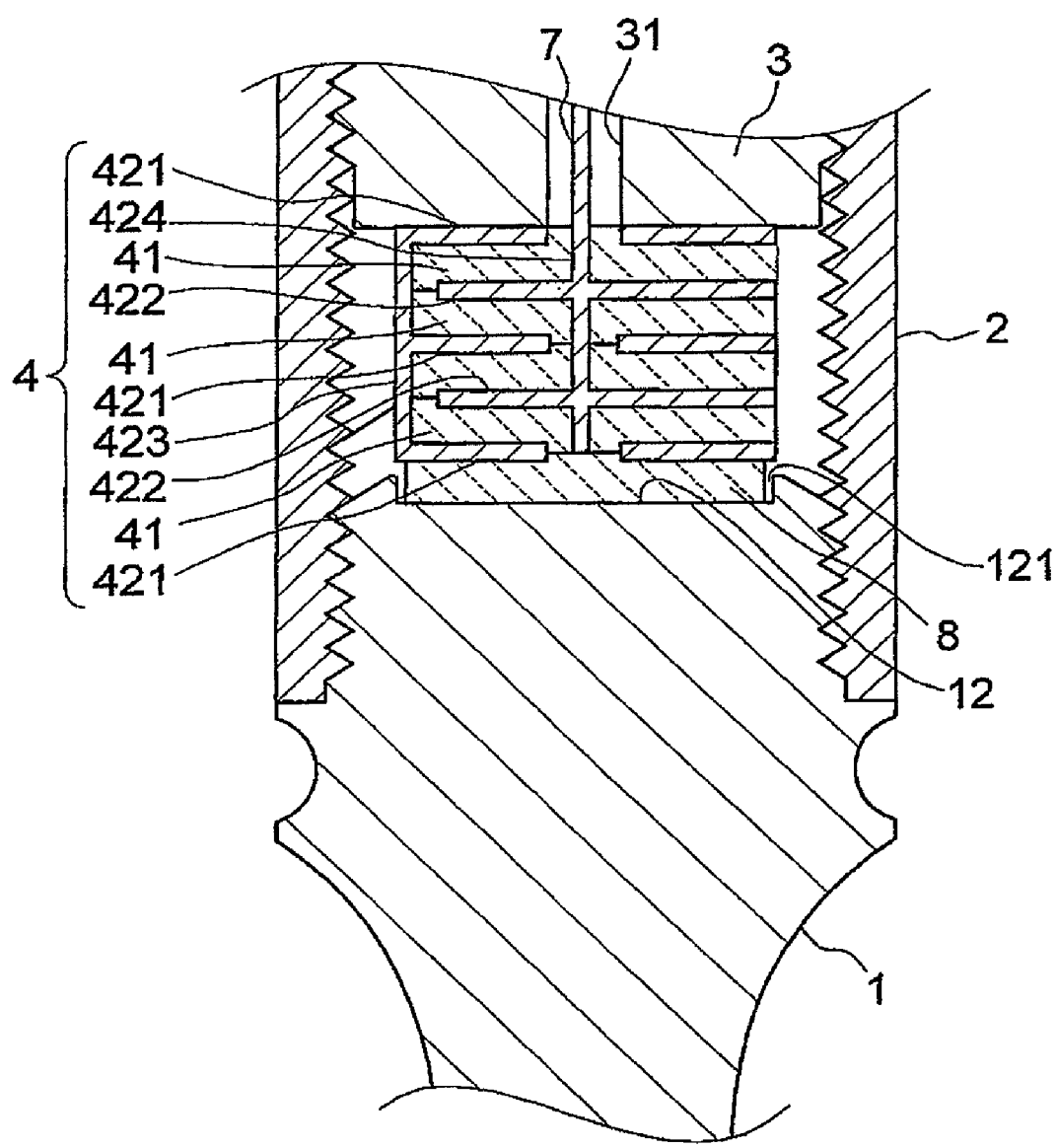
FIG. 10 is an enlarged cross-sectional view for explaining in enlarged form the piezoelectric ceramic body and its vicinities of the ultrasonic transducer in accordance with still another embodiment in which its structure is different from that of the ultrasonic transducer in FIG. 2.

A fitting recess 121 for fitting the one end face side of the piezoelectric ceramic body 4 should preferably be provided in the abutment surface 12 of the front member 1 against which the one end face of the piezoelectric ceramic body 4 abuts (see FIGS. 4, 8, and 10). The axial dimension of this fitting recess 121 should preferably be such a dimension that the one end face side of the piezoelectric ceramic body 4 can be easily fitted in the fitting recess 121, and such that the one end face side of the piezoelectric ceramic body 4 does not largely deviate in the radial direction within the fitting recess 121. Further, the axial dimension of this fitting recess 121 should preferably be substantially equal to the outside diameter of the one end face side of the piezoelectric ceramic body 4. This makes it possible to prevent the contact between the inner surface of the side member 2 and the outer surface of the piezoelectric ceramic body 4, thereby making it possible to prevent the vibration of the piezoelectric ceramic body 4 from being hampered as they come into contact with each other. Furthermore, in the case where such a fitting recess 121 is provided, it is possible to sufficiently prevent conduction due to the contact between the inner surface of the side member 2 and a conductive layer of the piezoelectric ceramic body 4 without interposing an insulating layer in a below-described manner.

The aforementioned "side member 2" is fitted at its one end side to the front member 1 on its side opposite to the ultrasonic radiating surface 11 thereof, and the piezoelectric ceramic body 4 is accommodated in its interior. The side member 2 is fitted to the front member 1 as, generally, a spiral thread threadedly provided on an outer surface of the front member 1 on the side opposite to the ultrasonic radiating surface 11 and a spiral thread threadedly provided on an inner surface of the side member 2 on one end side thereof are threadedly engaged. In addition, the inside diameter of the side member 2 and the outside diameter of the piezoelectric ceramic body 4 are set to such dimensions that the inner surface of the side member 2 and the outer surface of the piezoelectric ceramic body 4 are spaced apart from each other, whereby the inner surface of the side member 2 and the outer surface of the piezoelectric ceramic body 4 are prevented from coming into contact with each other, and the conduction due to the contact between the inner surface of the side member 2 and the conductive layer of the piezoelectric ceramic body 4 is prevented.

Although the material of the side member 2 is not particularly limited, the material of the side member 2 should preferably have sufficient strength that the side member 2 is difficult to undergo such as breakage even if it is brought into contact with another article or the like, so that the side member 2 is formed of a metal. The kind of this metal is not particularly limited, and it is possible to use various metals similar to those of the front member 1, and titanium, aluminum, and alloys containing these light metals, among others, are preferable. Further, the shape of the side member 2 is cylindrical, and provided on its inner surface is a spiral thread which is threadedly engaged with both the spiral thread threadedly provided on the outer surface of the front member 1 on the side opposite to the ultrasonic radiating surface 11 thereof and the spiral thread threadedly provided on the outer surface of the backing member 3 on the one end side thereof. In addition, the inside diameter of the side member 2 is greater than the outside diameter of the piezoelectric ceramic body 4, and the inner surface of the side member 2 and the outer surface of the piezoelectric ceramic body 4 are spaced apart from each other, but this spaced-apart distance (L) is set to not less than a value which is calculated by the following formula on the basis of an applied voltage (V):

$$L(mm)=V(kV)/3$$

Further, the insulator layer 5 should preferably be interposed between the inner surface of the side member 2 and the outer surface of the piezoelectric ceramic body 4 as in the case of the ultrasonic transducer 102 shown in FIG. 3. By thus interposing the insulator layer 5, it is possible to improve electric insulation properties between the conductive layer provided on the piezoelectric ceramic body 4 and the inner surface of the side member 2. The method of interposing this insulator layer 5 is not particularly limited, and it is possible to cite, for example, a method in which a heat shrinkable tube formed of an insulating material is fitted on the outer surface of the piezoelectric ceramic body 4 or a method in which an insulating tape formed of polyimide or the like is wound around the outer surface of the piezoelectric ceramic body 4. In addition, the insulator layer 5 may be provided by forming a film formed of an insulating material on at least one of the outer surface of the piezoelectric ceramic body 4 and the inner surface of the side member 2. In the case where such an insulator layer 5 is provided, it is possible to electrically insulate the conductive layer of the piezoelectric ceramic body 4 and the inner surface of the side member 2 reliably even if the fitting recess 121 for the fitting of the one end face side of the piezoelectric ceramic body 4 is not provided in the abutment surface 12 of the front member 1 against which the one end face of the piezoelectric ceramic body 4 is abutted, as described above.

The aforementioned "backing member 3" is fitted at its one end side to the other end side of the side member 2, and is a member for bringing the piezoelectric ceramic body 4 into pressure contact with the front member 1. The backing member 3 is fitted to the side member 2 as, generally, a spiral thread threadedly provided on the inner surface of the side member 2 on the other end side thereof and a spiral thread threadedly provided on the outer surface of the backing member 3 on the one end side thereof are threadedly engaged. Further, a through hole 31 which penetrates in the axial direction is provided in the backing member 3, and an electrode lead wire 7 connected to one electrode provided on the piezoelectric ceramic body 4 and constituted by conductive layer is inserted in this through hole 31. Meanwhile, an electrode terminal 6 which conducts with another electrode provided on the piezoelectric ceramic body 4 is provided on an end face or a side surface on the other end side of the backing member 3 (see FIGS. 2 and 3).

Although the material of the backing member 3 is not particularly limited, the material of the backing member 3 should preferably have sufficient strength that the backing member 3 is difficult to undergo such as breakage even if it is brought into contact with another article or the like, so that the backing member 3 is formed of a metal. The kind of this metal is not particularly limited, and it is possible to use various metals similar to those of the front member 1, and titanium, aluminum, and alloys containing these light metals, among others, are preferable. Further, although the shape of the backing member 3 is not particularly limited, it is possible to adopt such as a cylindrical shape, a circular truncated cone shape, or a shape in which a circular truncated cone or a small-diameter cylinder is extended from one end face of a cylinder or a circular disk.

In the ultrasonic transducers 101 and 102 of the above-described embodiments, the side member 2 is formed separately from the front member 1 and the backing member 3, and further division of the component parts is attempted, so that the workability of the single-piece parts can be improved. As a result, it becomes possible effect, among others, the application of a complex part configuration to the structure of the single-piece part for enhancing the function as a product. Therefore, according to the ultrasonic transducers 101 and 102 of these embodiments, it is possible to enhance the degree of freedom in the selection of the configurations of the respective parts (the front member 1, the side member 2, and the backing member 3) making up the main body of the ultrasonic transducer.

In the ultrasonic transducer, the electrodes of the piezoelectric ceramic body 4 are connected to external electrode terminals, and electricity is fed to the piezoelectric ceramic body 4 by using these electrode terminals. The electrodes can be connected to the external electrode terminals by various methods. In the ultrasonic transducer 101 or 102 in accordance with the invention, it is possible to adopt a form in which one electrode (constituted by the conductive layer of the piezoelectric ceramic body 4) of the electrodes provided on the piezoelectric ceramic body 4 is connected to the electrode terminal 6 mounted on the backing member 3 by using the backing member 3 as a conduction path, while an end portion of the electrode lead wire 7 inserted in the lead wire insertion hole 31 provided penetratingly through the backing member 3 is connected to the other electrode, and the other end portion of the electrode lead wire 7 is led out from the other end side of the backing member 3, the other end portion of this electrode lead wire 7 being connected to an electrode terminal (not shown) If only one electrode lead wire is thus used, the structure is simplified, with the result that the structure of the overall device can be simplified.

The aforementioned "piezoelectric ceramic body 4" is a member which, upon application of an ac voltage thereto, vibrates to generate ultrasonic waves. The piezoelectric ceramic which is used for forming a piezoelectric ceramic compact for constituting this piezoelectric ceramic body 4 is not particularly limited, and it is possible to cite, for example, barium titanate, lead titanate, lead zirconate titanate, and the like. In addition, the shape of the piezoelectric ceramic body 4 is not particularly limited, and it is possible to adopt a cylindrical shape, a disk shape, a prism with a square cross section, a plate-like body with a square cross section, or the like. Further, the piezoelectric ceramic body 4 is generally formed such that a stacked body in which a plurality of piezoelectric ceramic plates (comprising piezoelectric ceramic compacts and electrodes such as conductive layers) are stacked is clamped by the front member 1 and the backing member 3 and is thereby brought into pressure contact therewith. The reason that the plurality of piezoelectric ceramic plates are thus used is to prevent a crack from occurring in the piezoelectric ceramic body which cannot withstand an excessive tensile stress in a case where a high voltage is applied to obtain a sufficient output for practical use. In the case where the plurality of piezoelectric ceramic plates are clamped and are brought into pressure contact with each other, the number of the piezoelectric ceramic plates is not particularly limited, but is preferably set according to the kind of piezoelectric ceramic constituting the piezoelectric ceramic compact as well as the application of the ultrasonic transducer, the required output, and the like. This number can be set to 2 to 10, and is preferably set to 2 to 8 and is more preferably set to 2 to 6.

Figure 5:
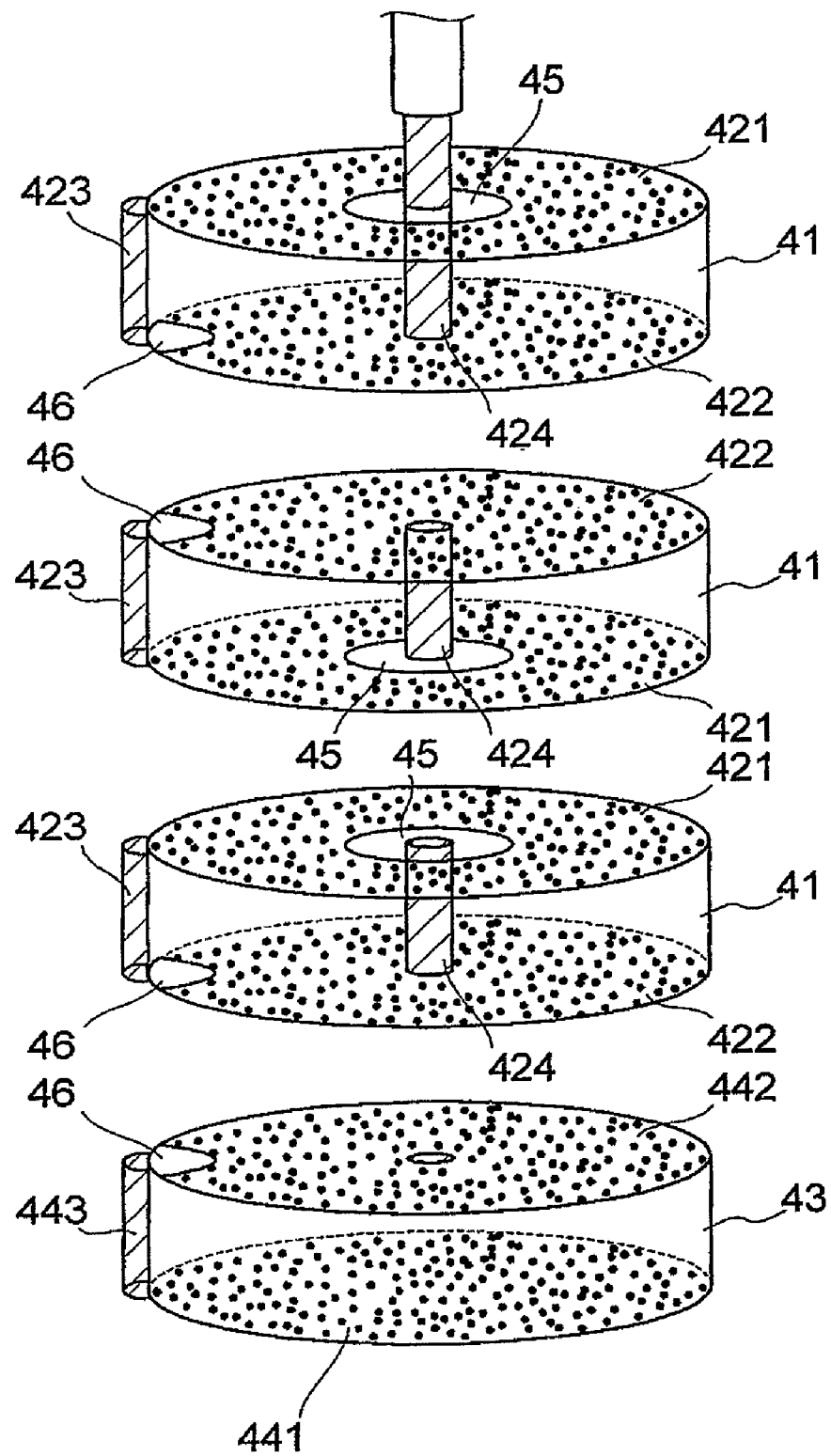
FIG. 5 is an exploded perspective view of the piezoelectric ceramic body of the ultrasonic transducer in FIG. 4 for explaining the details of the structure of each piezoelectric ceramic plate.

The structure of the piezoelectric ceramic body 4 is not particularly limited, but in order to provide a structure which facilitates the connection between the electrodes and the external electrode terminals, as described above, the piezoelectric ceramic body 4 should preferably have the following structure, as shown in FIGS. 4 and 5.

Namely, the piezoelectric ceramic body 4 has first piezoelectric ceramic plates and a second piezoelectric ceramic plate.

Figure 6:
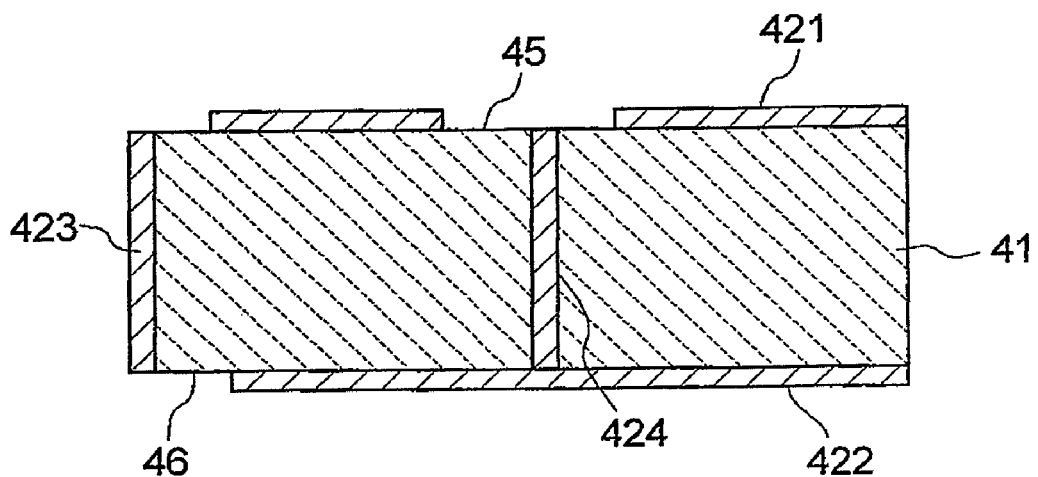
FIG. 6 is a cross-sectional view for explaining the details of a first piezoelectric ceramic plate for constituting the piezoelectric ceramic body in FIG. 5.
Figure 7:
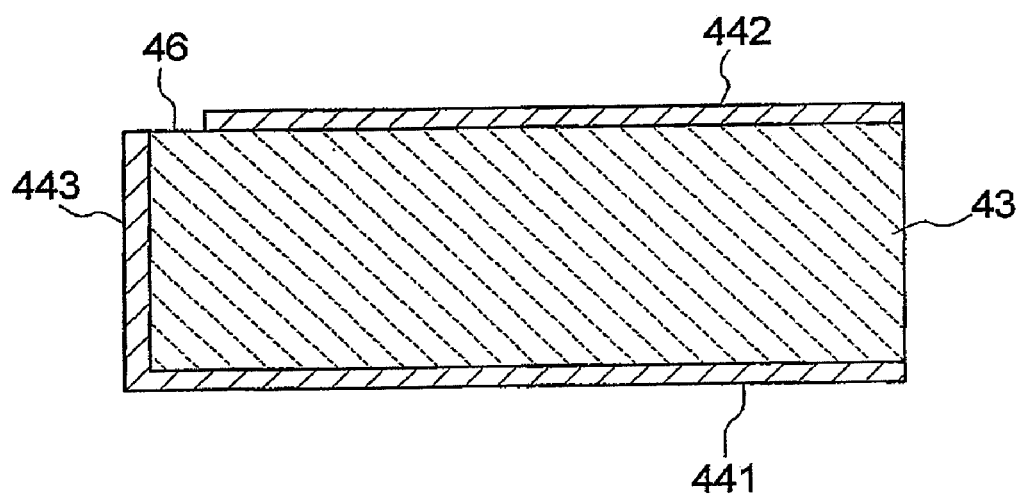
FIG. 7 is a cross-sectional view for explaining the details of a second piezoelectric ceramic plate for constituting the piezoelectric ceramic body in FIG. 5.

The aforementioned first piezoelectric ceramic plate includes a first piezoelectric ceramic compact 41 having a through hole extending in the thicknesswise direction; an electric conductor 424 filled in the through hole; a first one-surface side conductive layer 421 provided on one surface side at a portion excluding a peripheral edge portion (a portion 45 where the conductive layer 421 is not provided in FIGS. 5 and 6) of the through hole; a first other-surface side conductive layer 422 provided on the other surface side at a portion excluding a portion of a peripheral edge portion (a portion 46 where the conductive layer 422 is not provided in FIGS. 5 and 6); and a first side-surface side conductive layer 423 provided on a side surface and conductive to the first one-surface side conductive layer 421 but not conductive to the first other-surface side conductive layer 422.

In addition, an odd number of first piezoelectric ceramic plates 41 are formed into a stacked body so that their respective one-surface sides or their respective other-surface sides abut against each other alternately, and the front member side of this stacked body is formed by the first piezoelectric ceramic compact 41 and the first other-surface conductive layer 422.

Further, the aforementioned second piezoelectric ceramic plate 43 includes a second one-surface side conductive layer 441 provided on one surface side; a second other-surface side conductive layer 442 provided on the other surface side at a portion excluding a portion of a peripheral edge portion (a portion 46 where the conductive layer 442 is not provided in FIGS. 5 and 6); and a second side-surface side conductive layer 443 provided on a side surface and conductive to the first side-surface side conductive layer 423 and the second one-surface side conductive layer 441 but not conductive to the second other-surface side conductive layer 442.

In addition, the second piezoelectric ceramic plate 43 is interposed between the surface constituting the front member side of the stacked body and the abutment surface 12 of the front member 1 such that the second one-surface side conductive layer 441 and the abutment surface 12 abut against each other.

Such a piezoelectric ceramic body 4 makes it possible to provide the ultrasonic transducer 101 (see FIG. 2) or 102 (see FIG. 3) having a simple structure using only one electrode lead wire 7, as described above.

Figure 9:
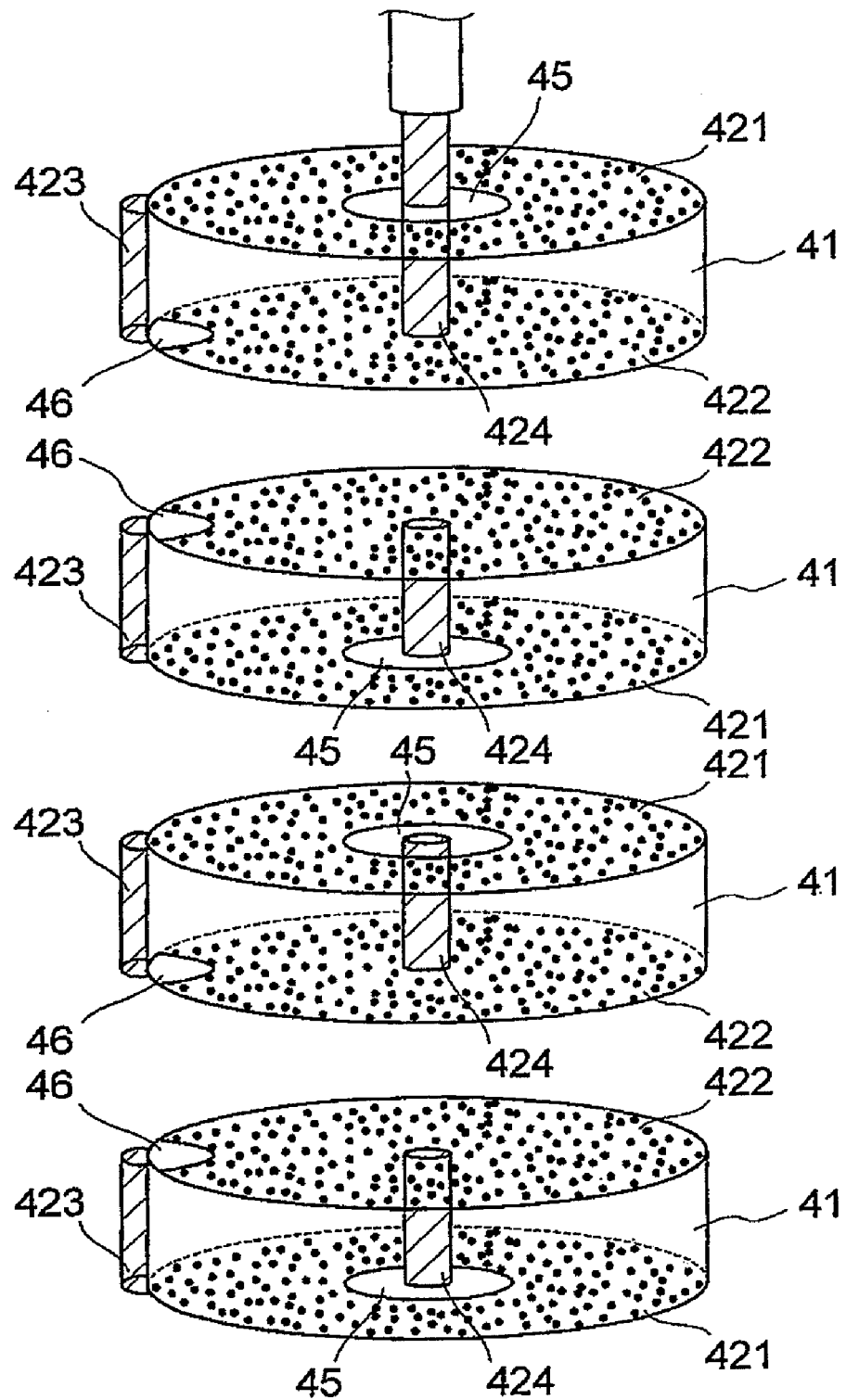
FIG. 9 is an exploded perspective view of the piezoelectric ceramic body of the ultrasonic transducer in FIG. 8 for explaining the details of the structure of each piezoelectric ceramic plate.

As another form of the piezoelectric ceramic body 4 which can be provided with a simple structure using only one electrode lead wire 7, it is possible to cite the following structure having the first piezoelectric ceramic plates, as shown in FIGS. 8 and 9.

Namely, the aforementioned first piezoelectric ceramic plate includes the first piezoelectric ceramic compact 41 having the through hole extending in the thicknesswise direction; the electric conductor 424 filled in the through hole; the first one-surface side conductive layer 421 provided on one surface side at a portion excluding a peripheral edge portion (the portion 45 where the conductive layer 421 is not provided in FIG. 9) of the through hole; the first other-surface side conductive layer 422 provided on the other surface side at a portion excluding a portion of a peripheral edge portion (the portion 46 where the conductive layer 422 is not provided in FIG. 9); and the first side-surface side conductive layer 423 provided on a side surface and conductive to the first one-surface side conductive layer 421 but not conductive to the first other-surface side conductive layer 422.

In addition, an even number of first piezoelectric ceramic plates are formed into a stacked body so that their respective one-surface sides or their respective other-surface sides abut against each other alternately, and the one surface and the other surface of this stacked body are each formed by the first piezoelectric ceramic compact 41 and the first one-surface conductive layer 421.

Further, an insulating recess 122 having a larger diameter than the diameter of an end face of the conductor 424 is provided in the abutment surface 12 of the front member 1 at a position opposing the end face of the conductor 424 (see FIG. 8).

Such a piezoelectric ceramic body 4 makes it possible to provide the ultrasonic transducer having a simple structure using only one electrode lead wire 7, as described above.

Figure 11:
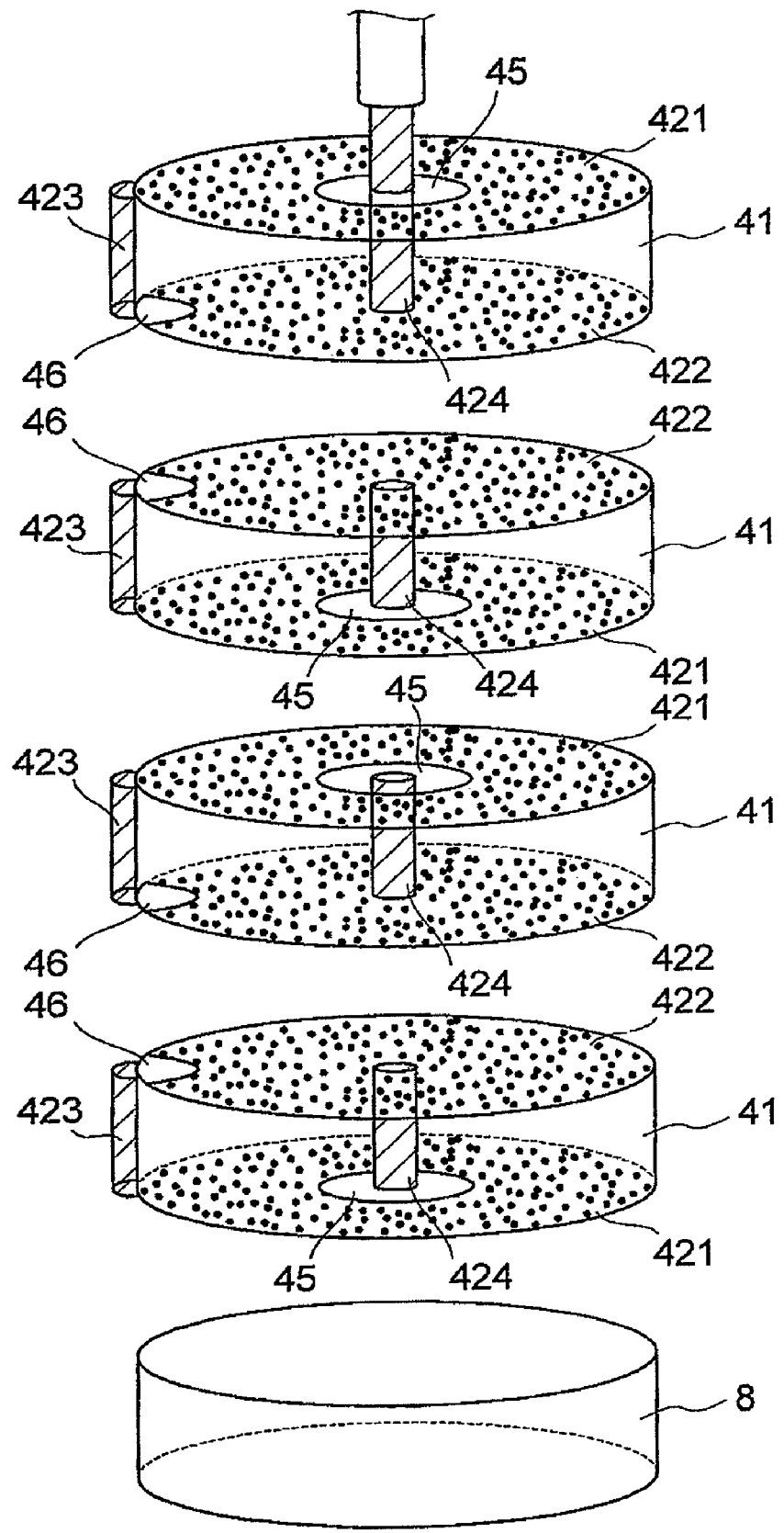
FIG. 11 is an exploded perspective view of the piezoelectric ceramic body of the ultrasonic transducer in FIG. 10 for explaining the details of the structure of each piezoelectric ceramic plate and an unpolarized ceramic plate.

As still another form of the piezoelectric ceramic body 4 which can be provided with a simple electrode-leading-out structure, it is possible to cite the following structure having the first piezoelectric ceramic plates, as shown in FIGS. 10 and 11.

Namely, the aforementioned first piezoelectric ceramic plate includes the first piezoelectric ceramic compact 41 having the through hole extending in the thicknesswise direction; the electric conductor 424 filled in the through hole; the first one-surface side conductive layer 421 provided on one surface side at a portion excluding a peripheral edge portion (the portion 45 where the conductive layer 421 is not provided in FIG. 11) of the through hole; the first other-surface side conductive layer 422 provided on the other surface side at a portion excluding a portion of a peripheral edge portion (the portion 46 where the conductive layer 422 is not provided in FIG. 11); and the first side-surface side conductive layer 423 provided on a side surface and conductive to the first one-surface side conductive layer 421 but not conductive to the first other-surface side conductive layer 422.

In addition, an even number of first piezoelectric ceramic plates are formed into a stacked body so that their respective one-surface sides or their respective other-surface sides abut against each other alternately, and the one surface and the other surface of this stacked body are each formed by the first piezoelectric ceramic compact 41 and the first one-surface conductive layer 421.

Further, an unpolarized ceramic plate 8 is interposed between the stacked body and the abutment surface 12 of the front member 1.

Such a piezoelectric ceramic body 4 makes it possible to provide the ultrasonic transducer having a simple structure using only one electrode lead wire 7, as described above.

Figure 12:
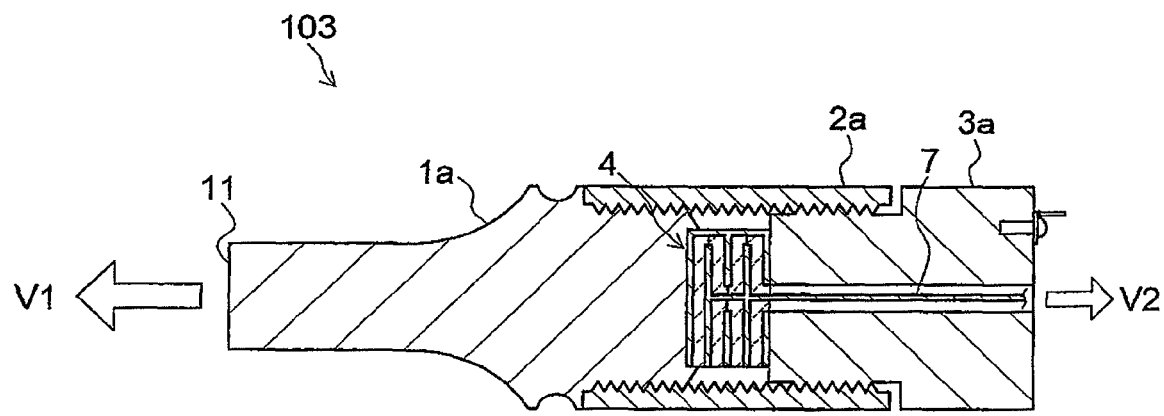
FIG. 12 is a cross-sectional view schematically illustrating the ultrasonic transducer in accordance with a further embodiment in which its structure is different from those of the ultrasonic transducers in FIGS. 2, 8, and 10.
Figure 13:
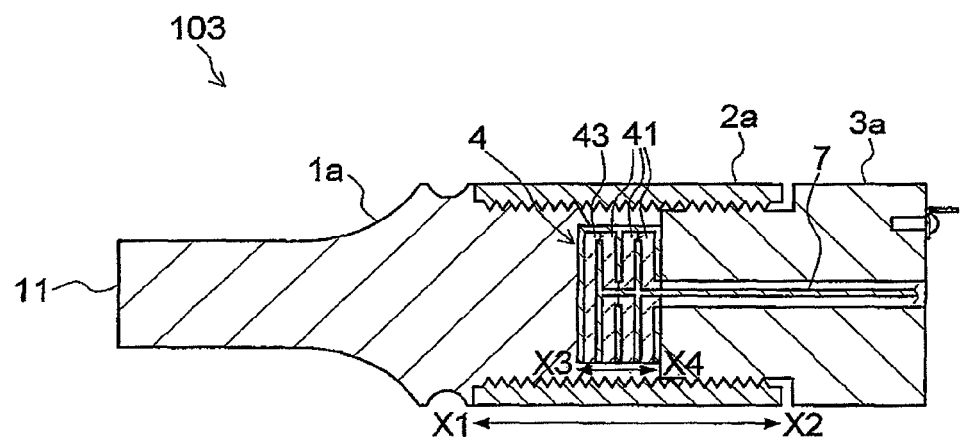
FIG. 13 is a cross-sectional view for explaining the temperature characteristics of the ultrasonic transducer in FIG. 12.

In addition, as a further embodiment of the invention, it is possible to cite by way of example an ultrasonic transducer 103 shown in FIGS. 12 and 13. Namely, in this ultrasonic transducer 103, as shown in FIG. 12, a material having a smaller internal loss of vibration (propagation loss of vibration) than the constituent material of a backing member 3a is used as the constituent material of a front member 1a. Specifically, the front member 1a is formed of, for example, an aluminum material (e.g., an aluminum alloy such as A5052P) in which the velocity of the sound c transmitted through that front member (medium) 1a is 6260 m/sec. or thereabouts. Meanwhile, the backing member 3a is formed of stainless steel such as SUS304, in which the velocity of the sound c transmitted through that backing member (medium) 3a is 5790 m/sec. or thereabouts.

Accordingly, in the ultrasonic transducer 103, as the front member 1a is formed of a material whose vibration propagation loss is smaller than the backing member 3a (e.g., a material with the aforementioned high sound velocity c), the vibrations generated by the piezoelectric ceramic body 4 can be efficiently propagated to the ultrasonic radiating surface 11 side at the distal end of the front member 1a. Consequently, according to the ultrasonic transducer 103, vibrational energy V1 which is substantially greater than vibrational energy V2 generated on the rear end side of the backing member 3a can be generated on the desired ultrasonic radiating surface 11 side.

In addition, in the ultrasonic transducer 103, the aforementioned aluminum material whose density (specific gravity) is smaller than the aforementioned stainless steel, i.e., the constituent material of the backing member 3a, is actively used as the constituent material of the front member 1a. Specifically, the density ρ of the aluminum material constituting the front member 1a is approximately 2.7 g/cm$^3$, while the density ρ of the stainless steel (e.g., SUS304) constituting the backing member 3a is 7.93 g/cm$^3$ or thereabouts. Therefore, according to the ultrasonic transducer 103, since the front member 1a can easily be made more lightweight than the backing member 3a, in the case of this structure, the front member 1a side can be displaced on a larger scale than the backing member 3a side on the basis of the vibrations generated by the piezoelectric ceramic body 4, as shown in FIG. 12, thereby making it possible to obtain stable vibrations with large amplitudes at the ultrasonic radiating surface 11.

Furthermore, in the ultrasonic transducer 103, as shown in FIG. 13, the coefficient of thermal expansion of a side member 2a has a value closer to the coefficient of thermal expansion of the piezoelectric ceramic body 4 than the coefficients of thermal expansion of the front member 1a and the backing member 3a. Specifically, these coefficients of thermal expansion specify the coefficient of thermal expansion in the axial direction of the ultrasonic transducer 103. Namely, the coefficient of thermal expansion of the aforementioned aluminum material constituting the front member 1a is 23×10$^{-6}$/° C., while the coefficient of thermal expansion of the aforementioned stainless steel (e.g., SUS304) constituting the backing member 3a is 17×10$^{-6}$/° C. or thereabouts. In addition, the aforementioned piezoelectric ceramic compact (a piezoelectric element body excluding the conductor layer portions of the piezoelectric ceramic plates 41 and 43) making up the major portion of the piezoelectric ceramic body 4 is formed of, for example, lead zirconate titanate (PZT), and its coefficient of thermal expansion is approximately 5.2×10$^{-6}$ (5.2 ppm)/° C. (room temperature to 200° C.).

Further, the side member 2a is formed of titanium (titanium alloy or the like), and its coefficient of thermal expansion is 8.4×10$^{-6}$/° C. or thereabouts. Here, as shown in FIG. 13, the side member 2a clamps the piezoelectric ceramic body 4 in a form in which the side member 2a is threadedly secured to the respective ones of the front member 1a and the backing member 3a, thereby imparting static pressure to that piezoelectric ceramic body 4. Namely, in the ultrasonic transducer 103, since the side member 2a is formed of a material having a value of the coefficient of thermal expansion which approximates the coefficient of thermal expansion of the piezoelectric ceramic body 4 in comparison with the coefficients of thermal expansion of the materials constituting the front member 1a and the backing member 3a, it is possible to reduce to a minimum amount the difference between the amount of expansion and contraction of the side member 2a which expands or contracts in the directions of arrows X1-X2 due to the temperature change of the working environment and the amount of expansion and contraction of the piezoelectric ceramic body 4 which similarly expands or contracts in the directions of arrows X3-X4, as shown in FIG. 13.

Therefore, according to the ultrasonic transducer 103, it is possible to suppress the fluctuations of the aforementioned static pressure due to the temperature change, thereby making it possible to suppress variations in the generation of vibrations attributable to the temperature change, i.e., improve the temperature characteristics of that ultrasonic transducer 103 body.

As already described, in the ultrasonic transducer 103, since the side portion of this ultrasonic transducer is constituted by the side member 2a which is separate from the front member 1a and the backing member 3a, as described above, the desired functional elements required for the product can be allotted to the members in a more finely divided form. Consequently, it becomes possible to select constituent materials more suitable for the respective members (the front member 1a, the side member 2a, and the backing member 3a), and it becomes possible to form the individual members by making most of the characteristics of the selected materials.

It should be noted that, in the ultrasonic transducer 103 having the above-described structure, the form in which the front member 1a, the side member 2a, and the backing member 3a are used instead of the front member 1, the side member 2, and the backing member 3 of the ultrasonic transducer 101 is mainly illustrated by using FIGS. 12 and 13. However, it is, of course, possible to configure an ultrasonic transducer of a form in which the front member 1, the side member 2, and the backing member 3 provided in the ultrasonic transducer shown in FIGS. 3, 8, and 10 are substituted by the front member 1a, the side member 2a, and the backing member 3a described above.

The method of manufacturing the ultrasonic transducer in accordance with the invention is not particularly limited.

The ultrasonic transducer can be manufactured as follows: For example, one end face of the piezoelectric ceramic body 4 is abutted against the abutment surface 12 of the front member 1 (or 1a), or one surface of the unpolarized ceramic plate 8 is abutted against the abutment surface 12 of the front member 1 (or 1a) (see FIG. 10). Subsequently, the spiral thread threadedly provided on the inner surface of the side member 2 (or 2a) on one end side thereof and the spiral thread threadedly provided on the outer surface of the front member 1 (or 1a) on the side opposite to the ultrasonic radiating surface 11 are threadedly engaged with each other. Next, the electrode lead wire 7 whose one end side is connected to the end face of the conductor 424 is inserted in the lead wire insertion hole 31 provided in the backing member 3 (or 3a), and the other end portion of the electrode lead wire 7 is led out from the other end side of the backing member 3 (or 3a) (see FIG. 2). Subsequently, the spiral thread threadedly provided on the inner surface of the side member 2 (or 2a) on the other end side thereof and the spiral thread threadedly provided on the outer surface of the backing member 3 (or 3a) on one end side thereof are threadedly engaged with each other. Next, the electrode terminal 6 is attached to the end face on the other end side of the backing member 3 (or 3a).

The ultrasonic apparatus in accordance with the invention has the ultrasonic transducer of the invention. This ultrasonic apparatus is not particularly limited, and is useful as an ultrasonic apparatus used in applications related to medical treatment, such as dental scaling, an ultrasonic cutter, ultrasonic welding, and the like

EXAMPLES

Example 1

The ultrasonic transducer 101 such as the one shown in FIGS. 2 and 4 to 6 was manufactured as follows.

[1] Fabrication of Front Member, Side Member, and Backing Member (1) Front Member The front member 1 made of a titanium alloy was fabricated which included: a disk portion with a diameter of 4 mm and a thickness of 1 mm; an extended portion extended concentrically from one surface side of the disk portion (the extended portion being constituted by a curved surface portion extended concentrically from one surface side of the disk portion and a cylindrical portion extended concentrically from this curved surface portion, the diameter of the cylindrical portion being 2 mm, the total length of the curved surface portion and the cylindrical portion being 10 mm, and the end face of the cylindrical portion constituting the ultrasonic radiating surface 11); and an extended portion extended concentrically from the other surface side of the disk portion and having a diameter of 3.5 mm and a length of 3.0 mm, a spiral thread being threadedly provided on the outer surface from its end face to a 2.5-mm position, and the fitting recess 121 with a diameter of 2.8 mm and a depth of 0.5 mm being provided on the abutment surface against which the piezoelectric ceramic body at the end face abutted.

(2) Side Member

The side member 2 made of a titanium alloy and having a hollow cylindrical shape was fabricated which had an outside diameter of 4 mm, an inside diameter of 2.62 mm, and a length of 10 mm, and in which a spiral thread was threadedly provided on its entire inner surface.

(3) Backing Member

The backing member 3 made of a titanium alloy was fabricated which included a cylindrical small-diameter portion which had a diameter of 4 mm and a length of 9.5 mm and in which a spiral thread was threadedly provided on the outer surface in a range extending from the position of 0.5 mm to the position of 5.0 mm from its end face, as well as a large-diameter cylindrical portion extended concentrically from the small-diameter cylindrical portion having a diameter of 4 mm and a length of 3.5 mm. The lead wire insertion hole 31 with a diameter of 0.8 mm was provided axially through a radially central portion of each of the small-diameter cylindrical portion and the large-diameter cylindrical portion. Further, the electrode terminal 6 was attached to the other end face of the backing member 3.

It should be noted that the dimension M from the boundary with the side member 2 to the ultrasonic radiating surface 11 in the axial length of the front member 1 was set to 11 mm which was ¼ of the wavelength λ calculated from the following formula on the basis of a resonance frequency of 100 kHz and by using sound velocity values measured by Model "R220" made by SONIC INSTRUMENTS INC. and sound velocity values of documents:

$$\lambda = V/f$$

where λ is the wavelength, V is the sound velocity, f is the resonance frequency, and the overall length of the ultrasonic transducer is 25.0 mm.

[2] Fabrication of Piezoelectric Ceramic Body (1) Unfired First Ceramic Plate

As the piezoelectric ceramic, an unfired first ceramic compact having a diameter of 2.5 mm and a thickness of 0.5 mm, having a 0.07 mm-diameter through hole provided in its radially central portion, and serving as a first ceramic compact by firing was fabricated by using lead zirconate titanate. Conductive paste containing silver and palladium was coated on an entire remaining surface excluding a 0.65 mm-diameter portion on one surface side of the unfired first ceramic compact and on an entire surface excluding a peripheral edge portion on the other surface side thereof, thereby forming an unfired first one-surface side conductive coating serving as the first one-surface conductive layer by firing and an unfired first other-surface side conductive coating serving as the first other-surface conductive layer by firing.

It should be noted that when the unfired first other-surface side conductive coating was formed, the conductive pasted flowed into the through hole, and an unfired conductor serving as a conductor by firing was thereby formed.

(2) Unfired Second Ceramic Plate,

An unfired second ceramic compact having a diameter of 2.5 mm and a thickness of 0.5 mm and serving as a second ceramic compact by firing was fabricated by using the aforementioned piezoelectric ceramic. The conductive paste was coated on the entire surface on one surface side of the unfired second ceramic compact and on an entire surface excluding a peripheral edge portion on the other surface side thereof, thereby forming an unfired second one-surface side conductive coating serving as the second one-surface conductive layer by firing and an unfired second other-surface side conductive coating serving as the second other-surface conductive layer by firing.

(3) Stacked Body

Three unfired first ceramic plates fabricated in (1) above were formed into a stacked body such that a first unfired first one-surface side conductive coating and a second unfired first one-surface side conductive coating abutted against each other, and such that the second unfired first other-surface side conductive coating and a third unfired first one-surface side conductive coating abutted against each other. Subsequently, the unfired second ceramic plate was stacked such that the unfired first other-surface side conductive coating of the third unfired first ceramic plate of this stacked body and an unfired second other-surface side conductive coating of the unfired second ceramic plate fabricated in (2) above abutted against each other.

(4) Unfired First Side-Surface Side Conductive Coating and Unfired Second Side-Surface Side Conductive Coating The aforementioned conductive paste was coated on the side surface of the stacked body prepared in (3) above to form an unfired first side-surface side conductive coating and an unfired second side-surface side conductive coating, such that they contacted each of the aforementioned unfired first one-surface side conductive coatings and the aforementioned unfired second one-surface side conductive coating, but did not contact with each of the aforementioned unfired first other-surface side conductive coatings and the aforementioned unfired second other-surface side conductive coating, and such that they contacted each other.

(5) Firing

The stacked body, the unfired second ceramic plate, the unfired first side-surface side conductive coating, and the unfired second side-surface side conductive coating, which were prepared in (4) above, were held at 900° C. for 2 hours in air atmosphere, to simultaneously fire the unfired conductive layers and the unfired conductors, thereby fabricating the piezoelectric ceramic body 4. In addition, an end portion of the electrode lead wire 7 provided with an insulating coating was joined to an end portion of the conductor 424 on the one surface side of the first piezoelectric ceramic plate of the piezoelectric ceramic body 4.

It should be noted the diameter of the piezoelectric ceramic body 4 after firing was 2.5 mm, and its length was 2 mm.

[3] Manufacture of Ultrasonic Transducer

One end face of the piezoelectric ceramic body 4 fabricated in [2] (5) above was abutted against the abutment surface 12 (surface roughness (Ra): 3.2 µm) of the front member 1 fabricated in [1] (1) above. Subsequently, the spiral thread threadedly provided on the inner surface of the side member 2 on one end side thereof and the spiral thread threadedly provided on the outer surface of the front member 1 on the side opposite to the ultrasonic radiating surface 11 were threadedly engaged with each other. Next, the electrode lead wire 7 was inserted in the lead wire insertion hole 31 provided in the backing member 3, and the other end portion of the electrode lead wire 7 was led out from the other end side of the backing member 3. Subsequently, the spiral thread threadedly provided on the inner surface of the side member 2 on the other end side thereof and the spiral thread threadedly provided on the outer surface of the backing member 3 on one end side thereof were threadedly engaged with each other to set the piezoelectric ceramic body 4 in a state of pressure contact, thereby manufacturing the ultrasonic transducer 101.

The ultrasonic transducer in accordance with the invention has a structure which is useful in applications in which it is used by being incorporated in a particularly small-sized ultrasonic apparatus, and can be used by being incorporated in various ultrasonic apparatuses related to medical treatment, as described above.

It should further be apparent to those skilled in the art that various changes in form and detail of the invention as shown and described above may be made. It is intended that such changes be included within the spirit and scope of the claims appended hereto.

This application is based on Japanese Patent Application JP 2007-089453, filed Mar. 29, 2007, and Japanese Patent Application JP 2008-075896, filed Mar. 24, 2008, the entire contents of which are hereby incorporated by reference, the same as if set forth at length.

What is claimed is:

1. An ultrasonic transducer comprising: a front member having a front side on which an ultrasonic radiating surface is provided and a back side which is opposite to the front side; a side member; a backing member; and a piezoelectric ceramic body, which are provided axially integrally, wherein one end side of the side member is fitted to the back side of the front member, one end side of the backing member is fitted to another end side of the side member, and the piezoelectric ceramic body is interposed between the front member and the backing member, wherein the front member has an abutment surface against which one end face of the piezoelectric ceramic body, and wherein a fitting recess for fitting the one end face side of the piezoelectric ceramic body is provided in the abutment surface.

2. The ultrasonic transducer according to claim 1, wherein the abutment surface of the front member against which the one end face of the piezoelectric ceramic body abuts has an arithmetical mean roughness of not more than 12.5 µm.

3. The ultrasonic transducer according to claim 1, wherein an insulator layer is interposed between an inner surface of the side member and an outer surface of the piezoelectric ceramic body.

4. The ultrasonic transducer according to claim 1,
wherein electrodes are provided on the piezoelectric ceramic body, and
wherein one of the electrodes provided on the piezoelectric ceramic body is electrically connected to an electrode terminal mounted on the backing member through the backing member as a conduction path, while an end portion of an electrode lead wire inserted in a lead wire insertion hole provided penetratingly through the backing member is connected to another of the electrodes provided on the piezoelectric ceramic body, and another end portion of the electrode lead wire is led out from another end side of the backing member.

5. The ultrasonic transducer according to claim 1, wherein the front member is made from a material having a smaller internal loss of vibration than a material from which the backing member is made.

6. The ultrasonic transducer according to claim 5, wherein the material from which the front member is made and the material from which the backing member is made are selected so that a velocity of sound transmitted through the front member becomes higher than a velocity of sound transmitted through the backing member.

7. The ultrasonic transducer according to claim 1, wherein the front member is made from a material whose density is smaller than a material from which the backing member is made.

8. The ultrasonic transducer according to claim 1, wherein a coefficient of thermal expansion of the side member has a value closer to a coefficient of thermal expansion of the piezoelectric ceramic body than coefficients of thermal expansion of the front member and the backing member.

9. The ultrasonic transducer according to claim 2, wherein the piezoelectric ceramic body comprises a first piezoelectric ceramic plate and a second piezoelectric ceramic plate,
the first piezoelectric ceramic plate comprises: a first piezoelectric ceramic compact having a through hole extending in a thicknesswise direction; an electric conductor filled in the through hole of the first piezoelectric ceramic compact; a first one-surface side conductive layer provided on one surface side at a portion excluding a peripheral edge portion of the through hole; a first other-surface side conductive layer provided on another surface side at a portion excluding a portion of a peripheral edge portion of the another surface side of the first piezoelectric ceramic plate; and a first side-surface side conductive layer provided on a side surface and conductive to the first one-surface side conductive layer but not conductive to the first other-surface side conductive layer, an odd number of the first piezoelectric ceramic plates are formed into a stacked body so that respective one-surface sides or respective other-surface sides of the first piezoelectric ceramic plates abut against each other alternately, and a surface of the stacked body serving as a front member side of the stacked body is formed by the other surface side of the first piezoelectric ceramic compact and the first other-surface conductive layer, the second piezoelectric ceramic plate comprises: a second piezoelectric ceramic compact; a second one-surface side conductive layer provided on one surface side of the second piezoelectric ceramic compact; a second other-surface side conductive layer provided on another surface side at a portion excluding a portion of a peripheral edge portion of the another surface side of the second piezoelectric ceramic plate; and a second side-surface side conductive layer provided on a side surface and conductive to the first side-surface side conductive layer and the second one-surface side conductive layer but not conductive to the second other-surface side conductive layer, and the second piezoelectric ceramic plate is interposed between the surface constituting the front member side of the stacked body and the abutment surface of the front member such that the second one-surface side conductive layer and the abutment surface abut against each other.

10. The ultrasonic transducer according to claim 2, wherein the piezoelectric ceramic body comprises a first piezoelectric ceramic plate, the first piezoelectric ceramic plate comprises: a first piezoelectric ceramic compact having a through hole extending in a thicknesswise direction; an electric conductor filled in the through hole of the first piezoelectric ceramic compact; a first one-surface side conductive layer provided on one surface side at a portion excluding a peripheral edge portion of the through hole; a first other-surface side conductive layer provided on another surface side at a portion excluding a portion of a peripheral edge portion of the another surface side of the first piezoelectric ceramic plate; and a first side-surface side conductive layer provided on a side surface and conductive to the first one-surface side conductive layer but not conductive to the first other-surface side conductive layer, an even number of first piezoelectric ceramic plates are formed into a stacked body so that respective one-surface sides or respective other-surface sides abut against each other alternately, and one surface and another surface of the stacked body are each formed by the first piezoelectric ceramic compact and the first one-surface conductive layer, and an insulating recess having a larger diameter than a diameter of an end face of the electric conductor is provided in the abutment surface of the front member at a position opposing the end face of the conductor.

11. The ultrasonic transducer according to claim 2, wherein the piezoelectric ceramic body comprises a first piezoelectric ceramic plate, the first piezoelectric ceramic plate comprises: a first piezoelectric ceramic compact having a through hole extending in a thicknesswise direction; an electric conductor filled in the through hole of the first piezoelectric ceramic compact; a first one-surface side conductive layer provided on one surface side at a portion excluding a peripheral edge portion of the through hole; a first other-surface side conductive layer provided on another surface side at a portion excluding a portion of a peripheral edge portion of the another surface side of the first piezoelectric ceramic plate; and a first side-surface side conductive layer provided on a side surface and conductive to the first one-surface side conductive layer but not conductive to the first other-surface side conductive layer, an even number of first piezoelectric ceramic plates are formed into a stacked body so that respective one-surface sides or respective other-surface sides abut against each other alternately, and one surface and another surface of the stacked body are each formed by the first piezoelectric ceramic compact and the first one-surface conductive layer, and an unpolarized ceramic plate is interposed between the stacked body and the abutment surface of the front member.

12. An ultrasonic apparatus comprising the ultrasonic transducer according to claim 1.

13. The ultrasonic transducer according to claim 1, wherein a first spiral thread is provided on the back side of the front member, wherein a second spiral thread is provided on the one end side of the side member, wherein a third spiral thread is provided on the another end side of the side member, wherein a fourth spiral thread is provided on the one end side of the back member, wherein the one end side of the side member is fitted to the back side of the front member by threadedly engaging the first spiral thread with the second spiral thread, and wherein the one end side of the back member is fitted to the another end side of the side member by threadedly engaging the third spiral thread with the fourth spiral thread.

14. The ultrasonic transducer according to claim 13, wherein the first spiral thread is provided on an outer surface of the front member, wherein the second and third spiral threads are provided on an inner surface of the side member, and wherein the fourth spiral thread is provided on an outer surface of the back member.

\* \* \* \* \*